(12) United States Patent
Ooi et al.

(10) Patent No.: US 9,455,218 B2
(45) Date of Patent: Sep. 27, 2016

(54) EMBEDDED DIE-DOWN PACKAGE-ON-PACKAGE DEVICE

(71) Applicants: Toong Erh Ooi, Butterworth (MY); Bok Eng Cheah, Bayan Lepas (MY); Nitesh Nimkar, Chandler, AZ (US)

(72) Inventors: Toong Erh Ooi, Butterworth (MY); Bok Eng Cheah, Bayan Lepas (MY); Nitesh Nimkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 13/852,876

(22) Filed: Mar. 28, 2013

(65) Prior Publication Data

US 2014/0291866 A1 Oct. 2, 2014

(51) Int. Cl.
*H01L 23/48* (2006.01)
*H01L 23/52* (2006.01)
(Continued)

(52) U.S. Cl.
CPC ........... *H01L 23/498* (2013.01); *H01L 21/486* (2013.01); *H01L 21/4857* (2013.01); *H01L 23/49822* (2013.01); *H01L 23/49827* (2013.01); *H01L 23/50* (2013.01); *H01L 23/5383* (2013.01); *H01L 23/5384* (2013.01); *H01L 23/5389* (2013.01); *H01L 25/105* (2013.01); *H01L 25/50* (2013.01); *H01L 24/19* (2013.01); *H01L 24/24* (2013.01); *H01L 24/73* (2013.01); *H01L 24/82* (2013.01); *H01L 2224/04105* (2013.01); *H01L 2224/12105* (2013.01); *H01L 2224/32145* (2013.01);
(Continued)

(58) Field of Classification Search
CPC .......... H01L 2224/73265; H01L 2224/48227; H01L 2224/32145; H01L 2924/15311; H01L 2924/1517
See application file for complete search history.

(56) References Cited

U.S. PATENT DOCUMENTS

2005/0161833 A1 7/2005 Takeuchi et al.
2006/0134835 A1 6/2006 He
(Continued)

FOREIGN PATENT DOCUMENTS

CN 1778151 5/2006
CN 101728337 2/2012
(Continued)

OTHER PUBLICATIONS

Intel Corporation, Notice of Preliminary Rejection for Korean Application No. 2014-0035901, (May 15, 2015).
(Continued)

*Primary Examiner* — Zandra Smith
*Assistant Examiner* — John M Parker
(74) *Attorney, Agent, or Firm* — Blakely, Sokoloff, Taylor & Zafman LLP

(57) ABSTRACT

An apparatus including a die; and a build-up carrier including alternating layers of conductive material and dielectric material disposed on a device side of the die and dielectric material embedding a portion of a thickness dimension of the die; and a plurality of carrier contact points disposed at a gradation between the device side of the die and the embedded thickness dimension of the die and configured for connecting the carrier to a substrate. A method including disposing a die on a sacrificial substrate with a device side of the die opposite the sacrificial substrate; forming a build-up carrier adjacent a device side of a die, wherein the build-up carrier includes a dielectric material defining a gradation between the device side of the die and a backside of the die, the gradation including a plurality of carrier contact points; and separating the die and the carrier from the sacrificial substrate.

9 Claims, 12 Drawing Sheets

(51) Int. Cl.
- *H01L 29/40* (2006.01)
- *H01L 23/498* (2006.01)
- *H01L 25/10* (2006.01)
- *H01L 25/00* (2006.01)
- *H01L 23/538* (2006.01)
- *H01L 23/50* (2006.01)
- *H01L 21/48* (2006.01)
- *H01L 23/00* (2006.01)
- *H05K 3/46* (2006.01)
- *H05K 1/18* (2006.01)

(52) U.S. Cl.
CPC ............ *H01L 2224/32225* (2013.01); *H01L 2224/48091* (2013.01); *H01L 2224/48227* (2013.01); *H01L 2224/73265* (2013.01); *H01L 2224/82039* (2013.01); *H01L 2225/0651* (2013.01); *H01L 2225/06568* (2013.01); *H01L 2225/1035* (2013.01); *H01L 2225/1058* (2013.01); *H01L 2225/1076* (2013.01); *H01L 2924/12042* (2013.01); *H01L 2924/15311* (2013.01); *H01L 2924/15331* (2013.01); *H01L 2924/181* (2013.01); *H01L 2924/1815* (2013.01); *H01L 2924/18162* (2013.01); *H05K 1/185* (2013.01); *H05K 3/4682* (2013.01); *H05K 2201/10674* (2013.01)

(56) References Cited

U.S. PATENT DOCUMENTS

| | | | |
|---|---|---|---|
| 2007/0035033 A1* | 2/2007 | Ozguz et al. | 257/777 |
| 2011/0018123 A1 | 1/2011 | An et al. | |
| 2011/0104858 A1 | 5/2011 | Katagiri et al. | |
| 2012/0001306 A1* | 1/2012 | Wang et al. | 257/666 |
| 2012/0319295 A1* | 12/2012 | Chi et al. | 257/774 |
| 2013/0026653 A1 | 1/2013 | Yamamichi et al. | |
| 2013/0105991 A1* | 5/2013 | Gan et al. | 257/777 |
| 2014/0091442 A1* | 4/2014 | Cheah et al. | 257/666 |

FOREIGN PATENT DOCUMENTS

| | | |
|---|---|---|
| JP | 2005209689 | 8/2005 |
| JP | 2009135391 | 6/2009 |
| JP | 2011096903 | 5/2011 |
| KR | 20110010015 | 1/2011 |

OTHER PUBLICATIONS

Intel Corporation, First Office Action in JP 2014-069161 mailed Mar. 17, 2015.

Intel Corporation, European Search Report mailed Nov. 25, 2014 for EP 14161193.9.

Intel Corporation, Office Action mailed Dec. 17, 2014 for EP 14161193.9.

Intel Corporation, "First Office Action", CN Application No. 2014-10267110, (May 5, 2016).

\* cited by examiner

US 9,455,218 B2

EMBEDDED DIE-DOWN PACKAGE-ON-PACKAGE DEVICE

BACKGROUND

1. Field

Packaging for microelectronic devices.

2. Description of Related Art

Microelectronic packaging technology, including methods to mechanically and electrically attach a silicon die (e.g., a microprocessor) to a substrate or other carrier continues to be refined and improved. Bumpless Build-Up Layer (BBUL) packaging technology is one approach to a packaging architecture. Among its advantages, BBUL packaging technology eliminates the need for assembly, eliminates prior solder ball interconnections (e.g., flip-chip interconnections), reduces stress on low-k interlayer dielectric of dies due to die-to-substrate coefficient of thermal expansion (CTE mismatch), and reduces package inductance through elimination of core and flip-chip interconnect for improved input/output (I/O) and power delivery performance.

With shrinking electronic device sizes and increasing functionality, there is a desire that integrated circuit packages to occupy less space. One way to conserve space is to combine a device or package on top of a package. One way of integrating second devices (e.g., secondary dice) vertically to, for example, a system on chip (SOC) package is through package on package (POP). With a drive for reduced thickness devices (e.g., handheld devices), constraints on POP device thickness or z-height remain a concern. In addition, constraints on routing distances between, for example, a central processing unit (CPU) of one package and a memory device or external input/output devices of another package also are relevant to, for example, the communication latency between devices.

DETAILED DESCRIPTION

Figure 1:
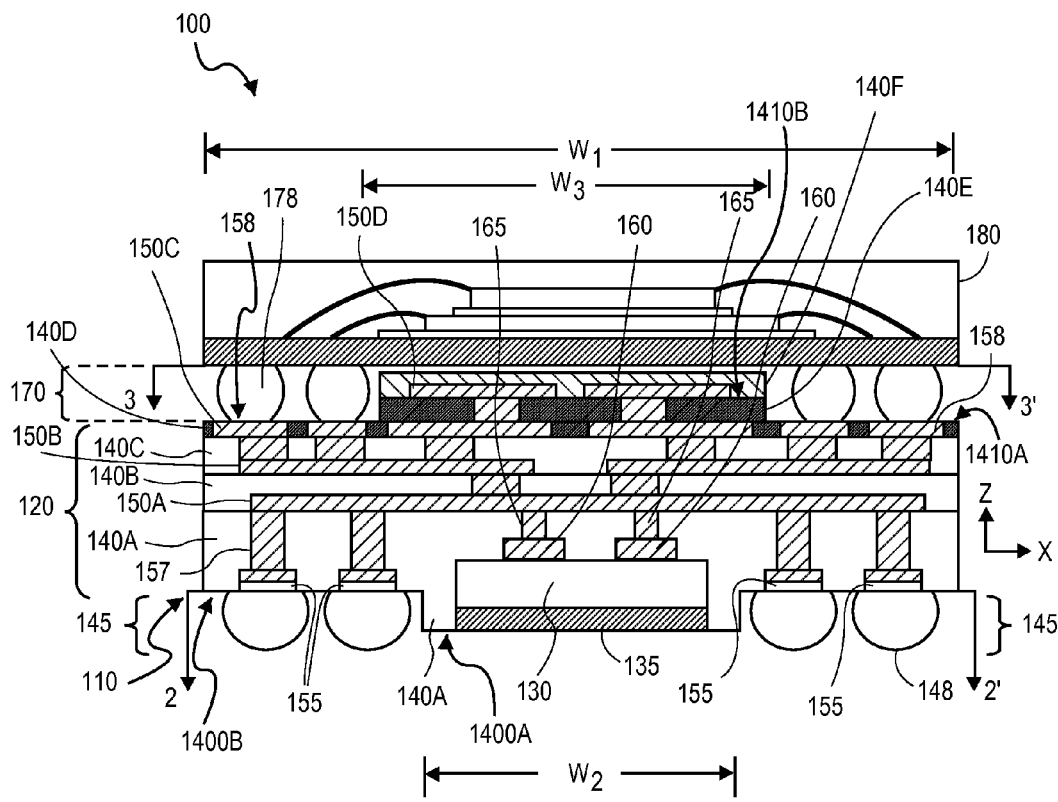
FIG. 1 shows a cross-sectional view of a package on package (POP) device integration assembly.

FIG. 1 shows a cross-sectional view of a package on package (POP) device integration apparatus or assembly according to one embodiment. As illustrated in FIG. 1, assembly 100 includes microelectronic package 110 that utilizes bumpless build-up layer (BBUL) packaging technology. Microelectronic package 110 includes carrier 120. Carrier 120 includes die 130, such as a microprocessor die or a system on chip (SOC) die, embedded in the carrier device side up (as viewed). In one embodiment, die 130 is a silicon die or the like having a thickness of approximately 150 micrometers (μm). In another example, die 130 can be a silicon die or the like that has a thickness less than 150 μm such as 50 μm to 150 μm. Die 130 is positioned, in this view, at a base of carrier 120 (a "die down" configuration).

FIG. 1 shows carrier 120 including multiple build-up layers including dielectric layers 140A, 140B, 140C, 140D and 140E of, for example, Ajinomoto build-up film (ABF) (e.g., dielectric layers 140A, 140B and 140C) or glass film (e.g., dielectric layers 140D and 140E) and electrically conductive layers or lines 150A, 150B, 150C and 150D (four shown) of, for example, copper or a copper alloy (connected with conductive vias or the like) that provide connectivity to die 130 (power, ground, input/output, etc.) through contacts 155 such as, for example, contacts suitable for a surface mount packaging implementation (e.g., a ball grid array). Dielectric layers 140A-D are respectively disposed between conductive layers 150A-D to insulate the conductive layers (i.e., the conductive material layers or lines and the dielectric material layers alternate in a stack from bottom to top as viewed). Die 130 and carrier 120 are in direct physical contact with each other (e.g., there are no solder bumps connecting die 130 to carrier 120). Die 130 is directly electronically connected through conductive pillars 160 to conductive vias 165 of carrier 120. Underlying a backside of die 130 in FIG. 1, as viewed, is adhesive layer 135 of, for example, a die backside film (DBF) polymer, an epoxy based dielectric adhesive with or without fillers.

With respect to the dielectric layers of carrier 120, as shown in FIG. 1, dielectric layer 140A surrounds the lateral sidewalls of die 130. In this manner, dielectric layer 140A embeds at least a portion of a thickness dimension of die 130. In the embodiment shown in FIG. 1, dielectric layer 140A embeds a portion of the lateral sidewall of die 130. In this embodiment, dielectric layer 140A also embeds the entire portion of a thickness dimension of adhesive layer 135.

In the embodiment shown in FIG. 1, microelectronic package 110 is configured to be connected to a printed circuit board at a base or die side of the package. Accordingly, carrier 120 includes contact points or pads 155 at its base for connection to a printed circuit board. Contact points or pads 155 are connected to conductive layer or line 150A (first level) through conductive vias 157 through dielectric layer 140A. Representatively, FIG. 1 shows a surface-mount packaging, such as a ball grid array (BGA) to mount microelectronic package to, for example, a printed circuit board or other board. FIG. 1 shows solder material 148 (e.g., solder balls) connected to microelectronic package 110 at contact points or pads 155.

With respect to contact points or pad 155 of carrier 120 in connection of microelectronic package 110 to a substrate, such as a printed circuit board, the contact points or pads are recessed or set-off in a different plane of dielectric layer 140A than a portion of the package including die 130. In one embodiment, contact points or pads 155 are disposed at a plane or gradation between a device side of the die and the embedded thickness dimension of the die. FIG. 1 shows dielectric layer 140A defining gradation 1400A at a base of microelectronic package 110 defined by the dielectric material or the dielectric layer embedding a thickness dimension of adhesive layer 135. The portion of dielectric layer 140A that embeds adhesive layer 135 and a portion of the lateral sidewalls of die 130 does not extend a width dimension, $W_1$, of carrier 120. Instead, that portion of dielectric layer 140A extends a width dimension, $W_2$, that is at least sufficient to surround the lateral sidewalls of die 130 but not sufficient to cover contact points or pads 155. Dielectric layer 140A also defines gradation 1400B, a distance from gradation 1400A. Contact points or pads 155 are exposed at gradation 1400B. The difference between a plane of gradation 1400A and gradation 1400B creates cavity 145 at base of assembly 100 between the carrier portion of the package and a substrate (e.g., a printed circuit board). In one embodiment, cavity 145 surrounds die 130. Disposed within cavity 145 are solder material (e.g., solder balls 148) configured to connect to a substrate such as a printed circuit board. The presence of cavity 145 reduces a z-dimension length (i.e., a z-height) of microelectronic package 110 and correspondingly assembly 100. In FIG. 1, the transition from gradation 1400A and 1400B is illustrated as a vertical line. It is appreciated that the transition may be other than vertical (e.g., a slope between 45° and 90° from 1400A to 1400B) and may be the result of tooling.

Figure 2:
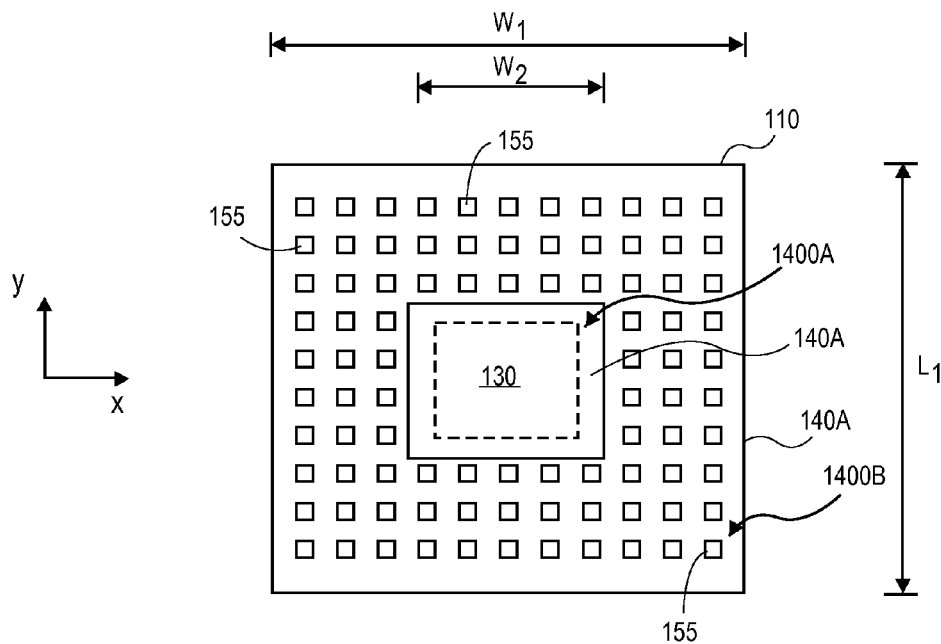
FIG. 2 shows a cross-sectional view of the assembly of FIG. 1 through line 2-2'.

FIG. 2 shows a cross-sectional view the package of FIG. 1 through line 2-2'. FIG. 2 shows gradation 1400A and gradation 1400B in dielectric layer 140A. In this embodiment, cavity 145 created by the difference in gradations of dielectric layer 140A and including solder material 148 (e.g., solder balls) extends about each lateral side of die 130. In another embodiment, cavity 145 may be two separate cavities, one on each side of opposing lateral sidewalls of die 130 such that gradation 1400A on dielectric layer 140A extends an entire width dimension (x-direction) or length dimension (y-direction) of microelectronic package 110. FIG. 2 also shows a single die, die 130, in microelectronic package 110. It is appreciated that, in another embodiment, another die or dies may be included in microelectronic package 110, such as arranged along a width or length dimension of microelectronic package 110.

Returning to FIG. 1, FIG. 1 shows alternating layers of conductive material and dielectric material. In this embodiment, assembly 100 includes four layers or lines of conductive material (e.g., conductive layers 150A, 150B, 150C and 150D). Conductive layer or line 150D is the ultimate layer in the sense that it is the layer aligned furthest from die 130. Conductive layer 150C is the penultimate layer. As shown in FIG. 1, conductive layer or line 150C is patterned to include contact points 158 for connection to a secondary device (e.g., a package, a die). A plane of dielectric layer 140D defines gradation 1410A at contact points 158. Between penultimate conductive layer 150C and ultimate conductive layer 150D is dielectric layer 140E. On ultimate conductive layer 150D is dielectric layer 140F. A plane of dielectric layer 140F defines gradation 1410B a distance from the plane of gradation 1410A. In this manner, contact points 158 are disposed at gradation 1410A between the ultimate conductive layer (conductive layer 150D) and the die and more specifically, in one embodiment, at the penultimate conductive layer (conductive layer 150C) or at dielectric layer 140D. As with the transition from gradation 1400A to 1400B, the transition from gradation 1410A to 1410B is shown as a vertical line, but in other embodiments may be other than vertical (e.g., a slope between 45° and 90°).

As illustrated in FIG. 1, collectively, a width dimension (x-direction) of dielectric layers 140A-C and conductive layers 150A-D of carrier 120 is represented by width, $W_1$. $W_1$ is greater than a width dimension of dielectric layers 140E-F and patterned conductive layer 150D, a width dimension of dielectric layers 140E and 140F represent as width, $W_3$. The difference in width dimensions ($W_1$-$W_3$) creates cavity 170 between microelectronic package 110 and a secondary device, such as package 180 shown connected to microelectronic package 110 in FIG. 1. In this embodiment, package 180 is connected to microelectronic package 110 through solder material connections 178 (e.g., solder balls) at contact points 158. Solder material connections 178 to contact points 158 and to package 180 occur in cavity 170. Because solder material connections 178 are disposed within cavity 170, the height or z-dimension of assembly 100 is reduced over a z-dimension without cavity 170.

Figure 3:
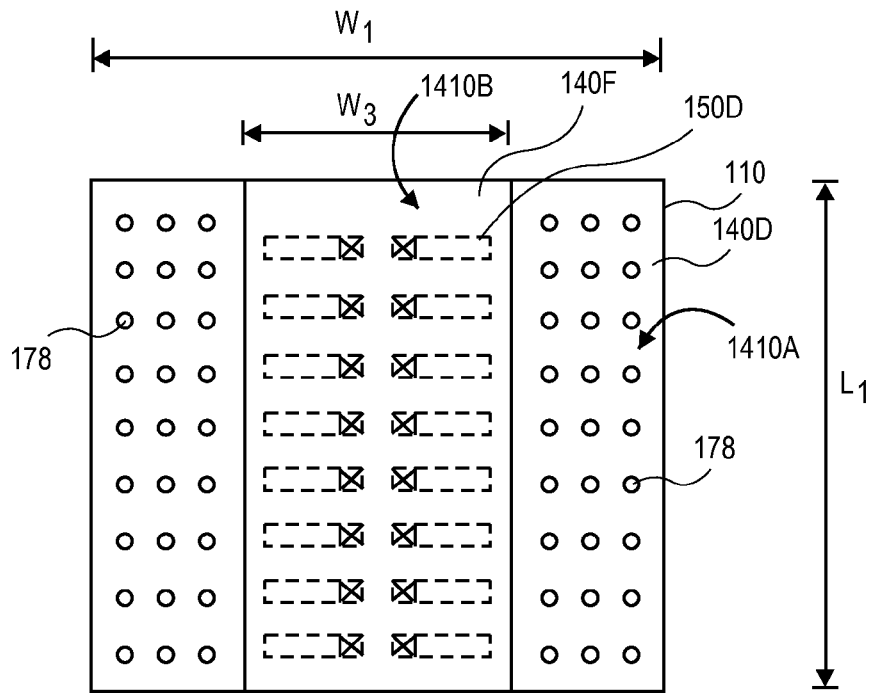
FIG. 3 shows a cross-sectional view of the assembly of FIG. 1 through line 3-3'.

FIG. 3 shows a cross-sectional view of microelectronic package 110 through line 3-3'. The cross-sectional view illustrates gradation 1410A and gradation 1410B. In this embodiment, microelectronic package 110 includes gradation 1410B extending a length dimension, $L_1$, across microelectronic package 110 and a width dimension, $W_3$, that is less than an entire width dimension, $W_1$, of the package. Gradation 1410A and associated cavity 170 is disposed on opposing lateral sides of the cross-sectional area associated with gradation 1410B (i.e., the lateral sides of dielectric layer 140E and dielectric layer 140F). FIG. 3 also shows solder material connections 178 disposed on contact points or pads 158 of package 110 in areas of gradation 1410A. It is appreciated that the number of contact points or pads 158 may vary according to the requirements of the device or devices to be attached to package 110.

Figure 4:
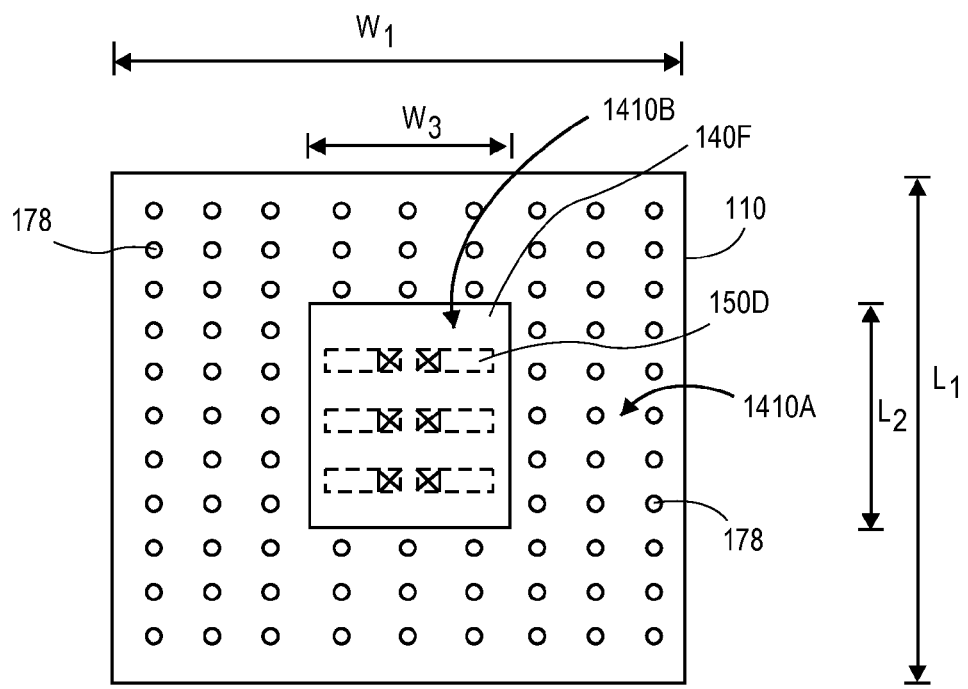
FIG. 4 shows a cross-sectional view of the assembly of FIG. 1 through line 3-3' according to another embodiment.

FIG. 4 shows an alternative embodiment of package 110 through line 3-3'. In this embodiment, gradation 1410B extends a length dimension, $L_2$, that is less than an entire length dimension, $L_1$ of the package. In this manner, an area covered by gradation 1410A is larger because such area can be disposed adjacent each of the four lateral sides of gradation 1410B. The larger area of gradation 1410A allows for the placement of additional contact points or pads and the associated increased solder material connections 178 as may be necessary depending on, for example, the requirements of a secondary device or devices to be connected to package 110.

Figure 5:
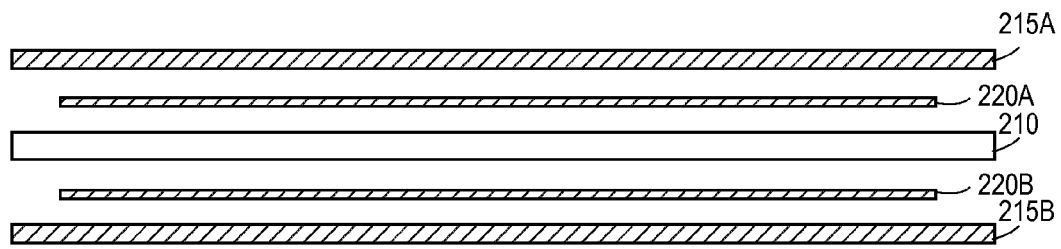
FIG. 5 shows an exploded cross-sectional side view of a portion of a sacrificial substrate and copper foil layers.
Figure 6:
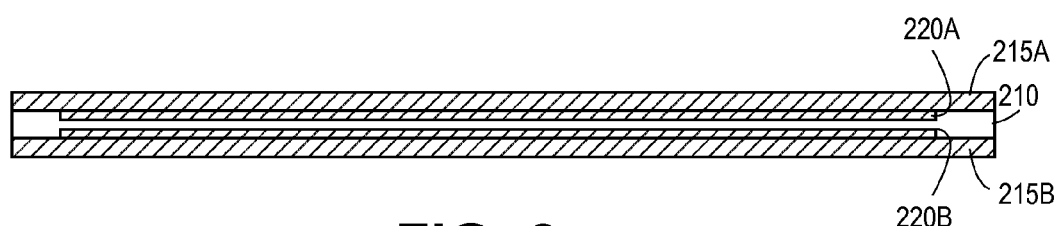
FIG. 6 shows the structure of FIG. 5 with the copper foil layers on the sacrificial substrate.

FIGS. 5-22 describe one embodiment for forming a microelectronic package, such as microelectronic package 110 (FIG. 1). Referring to FIG. 5, FIG. 5 shows an exploded cross-sectional side view of a portion of sacrificial substrate 210 of, for example, a prepeg material including opposing layers of copper foils 215A and 215B that are separated from sacrificial substrate 210 by shorter copper foil layers 220A and 220B, respectively. Copper foils 215A and 215B tend to stick to the shorter foils based on vacuum. FIG. 6 shows the assembled structure of FIG. 5. One technique of forming build-up packages is to form two separate packages or a sacrificial substrate, one on a top surface of sacrificial substrate 210 and one on a bottom surface (as viewed). At some point during the formation process, the two packages are separated from sacrificial substrate 210. The following formation process follows this technique.

Figure 7:
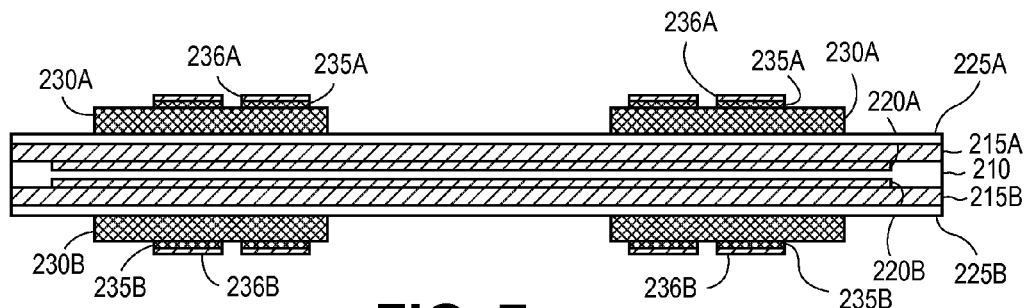
FIG. 7 shows the structure of FIG. 6 following the introduction of a dielectric layer and the introduction and patterning of a spacer layer and introduction of contact pads on the spacer layer.

FIG. 7 shows the structure of FIG. 6 following the introduction of dielectric material layer 225A and dielectric material layer 225B on foil layer 215A and foil layer 215B, respectively. In one embodiment, dielectric material layer 225A/225B is an ABF material introduced as a film over the respective surfaces of the substrate. In one embodiment, a suitable thickness for dielectric material layer 225A/225B is on the order of 20 microns.

Overlying dielectric material layer 225A and dielectric material layer 225B, respectively is spacer layer 230A and spacer layer 230B. In one embodiment, spacer layer 230A/230B is a copper material (e.g., copper or a copper alloy) having a thickness selected for a thickness or depth of a cavity on a substrate connection side of a package (e.g., cavity 145 in FIG. 1). A representative thickness dimension is on the order of 50 microns to 65 microns. In one embodiment, spacer layer 230A/230B is introduced across the surface of the structure (e.g., as a film (laminated film)) and then patterned to a length and width dimension of the desired cavity or cavities. One representative patterning technique is to introduce a light sensitive material such as a dry film resist (DFR) material; expose the light sensitive material to a light source through a mask to render a portion of the light sensitive material soluble in a developer; remove the soluble portion of the light sensitive material with a developer to leave a patterned light sensitive material layer; etch spacer layer 230A/230B through the patterned light sensitive material layer; and remove the light sensitive material layer. FIG. 7 shows the patterned spacer layer.

Overlying or on spacer layer 230A and spacer layer 230B are contact pads 235A and contact pads 235B. In one embodiment, contact pads 235A and contact pads 235B are, for example, a gold material (e.g., gold, gold alloy) deposited using an electroless seed layer followed by a dry film resist (DFR) patterning and plating. Contact pads 235A/235B are configured for connection of the package to a substrate such as a printed circuit board (e.g., contact pads 155 in FIG. 1). The number and position of the pads will therefore be dictated, at least in part, by the requirements of connection of the package to a substrate.

On each contact pad 235A/235B is secondary pad material 236A and secondary pad material 236B such as copper (e.g., copper, copper alloy) also deposited using a plating technique. In another embodiment, alternative surface finishing layers, e.g., nickel and/or palladium may be added such as in between contact pads 235A/235B and secondary pad material 236A/236B to, for example, improve solder joint reliability.

Figure 8:
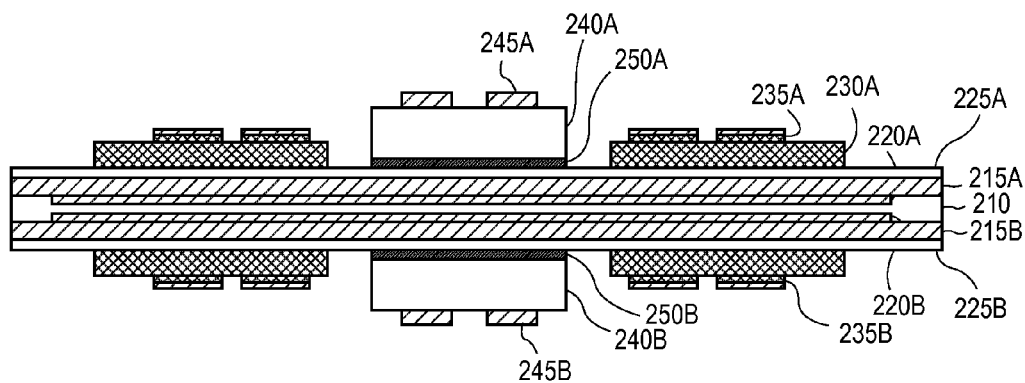
FIG. 8 shows the structure of FIG. 7 following the introduction of a die on the structure between the patterned spacer layer.

FIG. 8 shows the structure of FIG. 7 following the mounting of die 240A and die 240B on opposite sides of the structure. As shown in FIG. 8, die 240A is attached to adhesive 250A and die 240B is attached to adhesive 250B. A suitable adhesive material for 250A and adhesive 250B is DBF. Die 240A and die 240B are positioned device side up (device side facing away from each copper foil). On a device side of each die, FIG. 8 shows that conductive pillars 245A and 245B are connected to the contact points of die 240A and die 240B, respectively. Pillars 245A and pillars 245B may be fabricated at the die fabrication stage.

Figure 9:
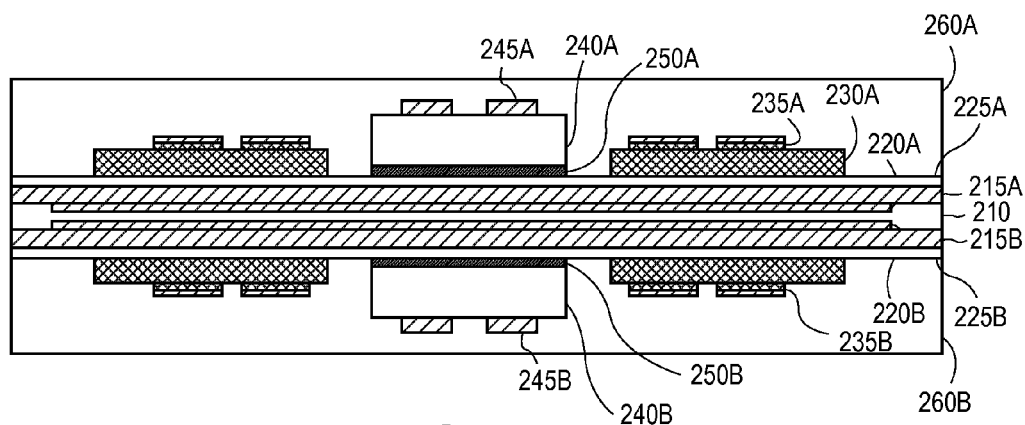
FIG. 9 shows the structure of FIG. 8 following the introduction of dielectric material on the structure.

FIG. 9 shows the structure of FIG. 8 following the introduction of a dielectric layer on each side of the structure. FIG. 9 shows dielectric layer 260A and dielectric layer 260B. In one embodiment, dielectric layer 260A and dielectric layer 260B are each an ABF dielectric material possibly including a filler that have been described for use in forming a BBUL package. One method of introduction of an ABF material is as a film that is laid on the respective dice, the contacts and copper foils.

Figure 10:
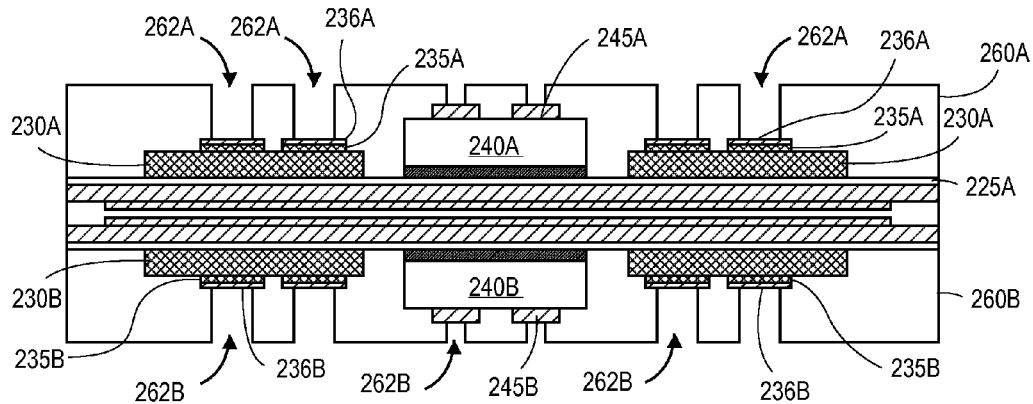
FIG. 10 shows the structure of FIG. 9 following the formation of openings to the contact pads on the spacer layer and to the die.

FIG. 10 shows the structure of FIG. 9 following the opening of vias 262A and 262B in dielectric layer 260A and dielectric layer 260B to contacts 236A, contacts 236B, pillars 245A and pillars 245B. In one embodiment, such openings or vias may be achieved by a laser process.

Figure 11:
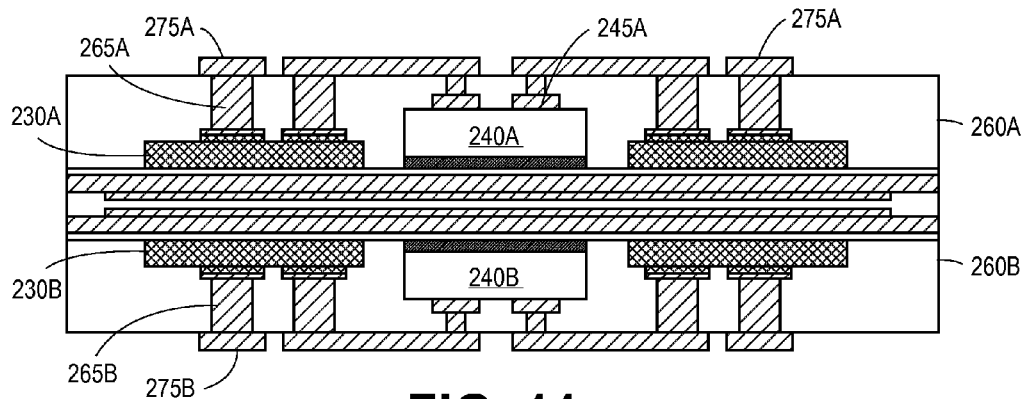
FIG. 11 shows the structure of FIG. 10 following the patterning of electrically conductive vias to contact points on the spacer layer and the die and the patterning of a first electrically conductive layer or line on the dielectric layer.

FIG. 11 shows the structure of FIG. 10 following the patterning of a conductive line or layer 275A and conductive line or layer 275B on dielectric layer 260A and dielectric layer 260B, respectively, and conductive vias 265A and 265B formed through the respective dielectric layers to contacts 236A and contacts 236B, respectively. Conductive vias are also formed to pillars 245A and pillars 245B to contact points on a device side of die 240A and die 240B. A suitable material for patterned conductive line or layer 275A/275B and for conductive vias 265A/265B is copper deposited, for example, by an electroplating process.

Figure 12:
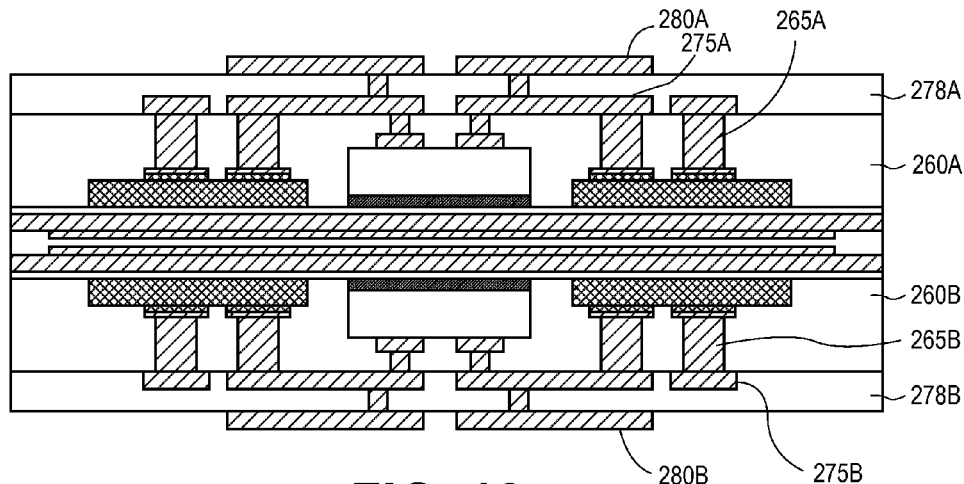
FIG. 12 shows the structure of FIG. 11 following the introduction of a second dielectric layer on the first conductive layer and electrically conductive vias to the first conductive layer and patterning of a second electrically conductive layer or line on the second dielectric layer.

FIG. 12 shows the structure of FIG. 11 following the patterning of an additional level of conductive line or layer of a carrier. FIG. 12 shows conductive line or layer 280A and conductive line or layer 280B separated from conductive line or layer 275A and 275B, respectively by dielectric layer 278A and 278B, respectively (e.g., an ABF film). A typical BBUL package may have four to six levels of conductive lines or traces similar to conductive lines or layers 275A, 275B, 280A and 280B separated from adjacent lines by dielectric material (e.g., ABF film). Connections between the layers are made, in one embodiment, by conductive vias (e.g., copper filled vias) formed by laser drilling the vias and depositing a conductive material in the vias by way of an electroplating process.

Figure 13:
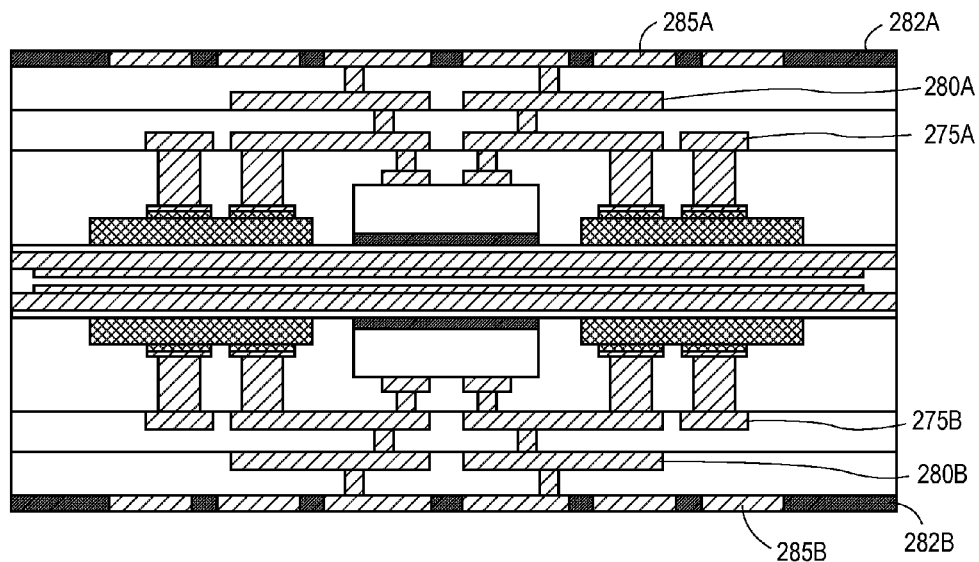
FIG. 13 shows the structure of FIG. 12 following the introduction of a third dielectric layer on the second conductive layer and electrically conductive vias to the second conductive layer and patterning of conductive lands on the third dielectric layer and the introduction of a fourth dielectric layer.

FIG. 13 shows the structure of FIG. 12 following the introduction and patterning of conductive lines or layers 285A and 285B (third level). In one embodiment, at least a portion of conductive lines or layers are patterned into lands or pads for packaging implementation (e.g., to connect to an external component such as a package or die) while another portion of lines or layers 290A and 290B are patterned to route signals. FIG. 13 also shows the structure after the introduction of dielectric layer 282A and dielectric layer 282B on respective sides of the structure. In one embodiment, dielectric layer 282A/282B is a glass cloth (ABF glass cloth) introduced or laminated as a film or sheet across the surface of the structure. Glass cloth has a property that renders the dielectric layer stiffer than a conventional ABF layer. In another embodiment, dielectric layer 282A/282B is a conventional ABF layer. In one embodiment, dielectric layer 282A and dielectric layer 282B are laminated on conductive line or layer 285A and conductive line or layer 285B, respectively.

Figure 14:
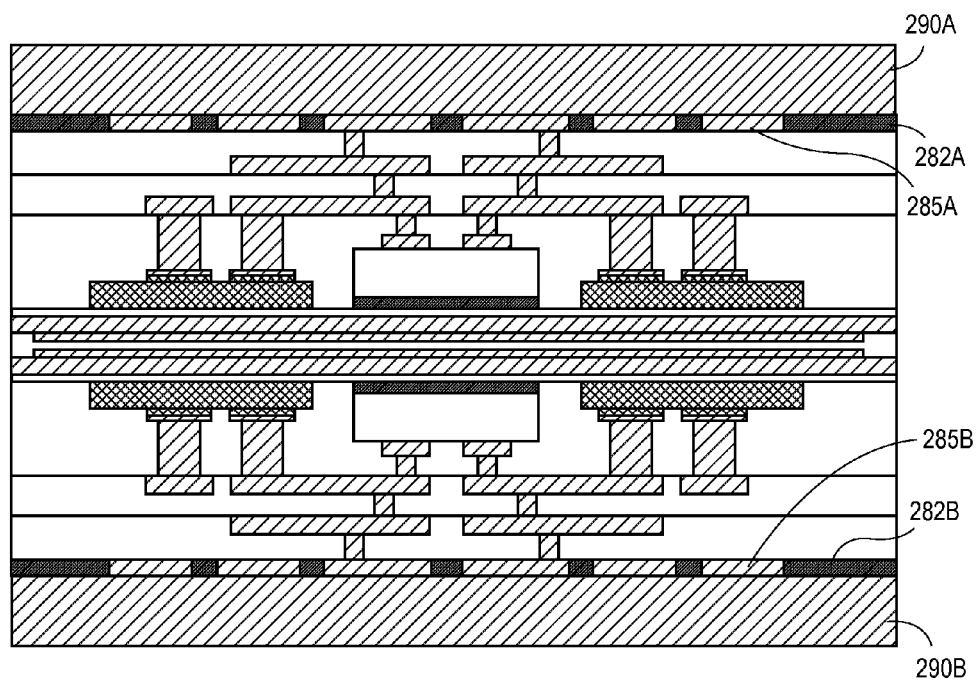
FIG. 14 shows the structure of FIG. 13 following the introduction of a second spacer layer on the conductive layer.

FIG. 14 shows the structure of FIG. 13 following the introduction of spacer layer 290A and spacer layer 290B on conductive line 285A and conductive line 285B and dielectric layer 282A and dielectric layer 282B. In one embodiment, spacer layer 290A and spacer layer 290B are a copper material (e.g., copper or copper alloy) introduced by lamination and/or hot press process. The copper material is introduced to a thickness selected for a cavity to be formed between a microelectronic package that is being formed and a secondary device, such as a secondary package or substrate (e.g., cavity 170 between package 110 and secondary device 180 in FIG. 1). A representative thickness is on the order of 70 microns.

Figure 15:
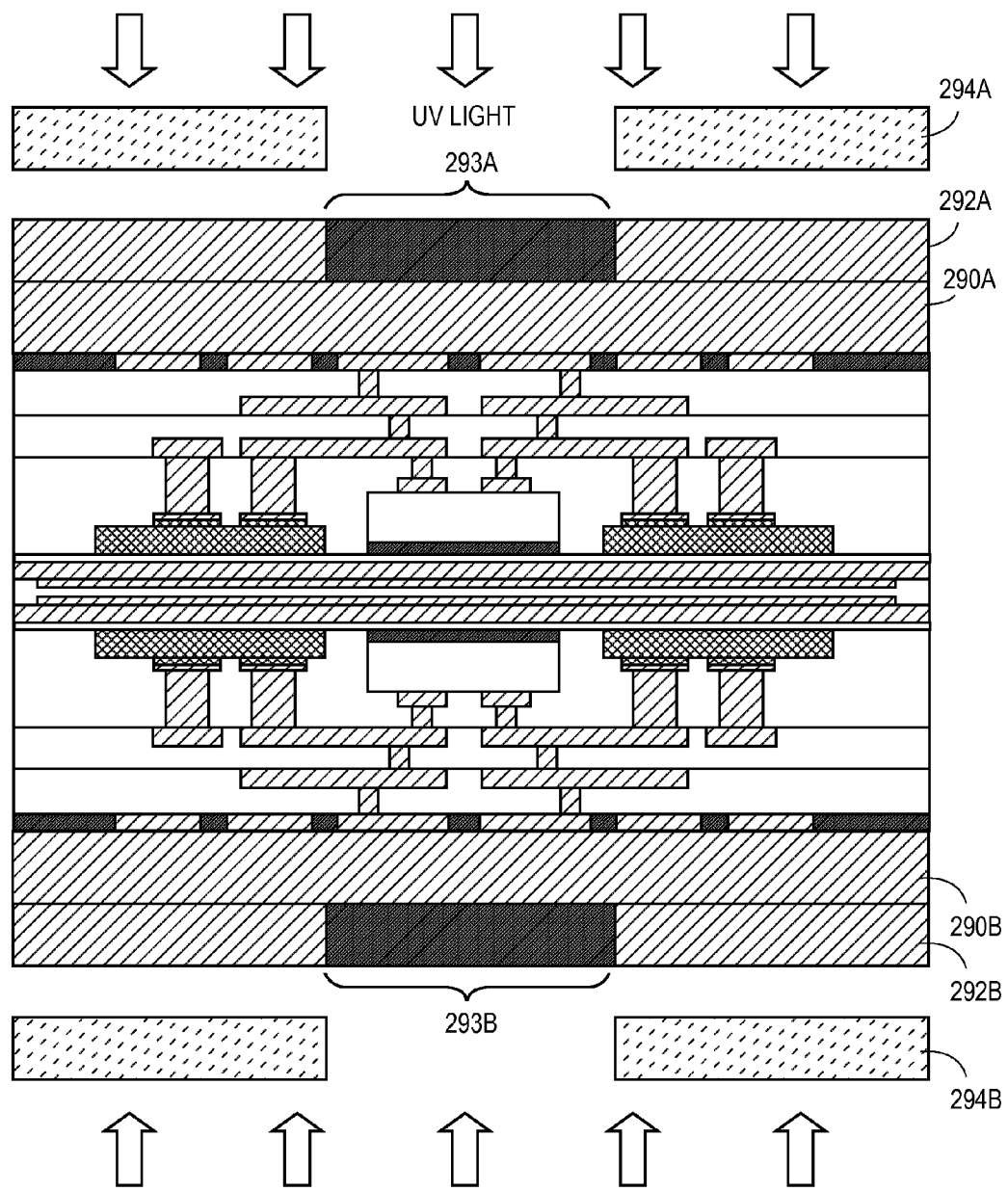
FIG. 15 shows the structure of FIG. 14 following the introduction of a light sensitive material on the structure and the patterning of the light sensitive material with ultraviolet light.

FIG. 15 shows the structure of FIG. 14 following the introduction of a light sensitive material such as a dry film resist (DFR) on the structure. FIG. 15 shows DFR layer 292A on spacer layer 290A and DFR layer 292B on spacer layer 290B. In one embodiment, following introduction, each DFR layer is exposed to ultraviolet light through a mask (mask 294A and mask 294B, respectively) to render a portion the DFR layer soluble to a developer. In this embodiment, portion 293A and portion 293B are exposed to the ultraviolet light. The dimensions of portion 293A of DFR layer 292A and portion 293B of DFR layer 292B is selected, in one embodiment, based on an area of the microelectronic package in which a cavity is not to be formed (e.g., an area represented by width $W_3$ in FIG. 1). Following ultraviolet light exposure, portion 293A and portion 293B are removed with a developer to produce a pattern that can be transferred to spacer layer 290A and spacer layer 290B.

Figure 16:
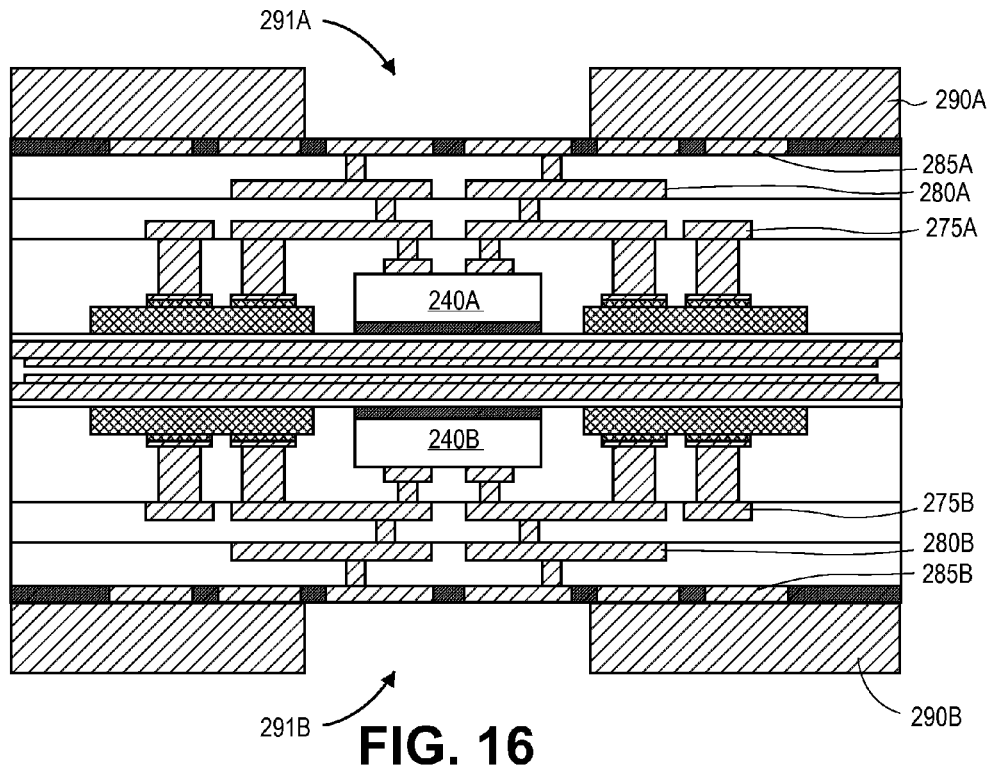
FIG. 16 shows the structure of FIG. 15 following the removal of material from an area of spacer layer and the corresponding conductive layer to expose an area including the third conductive layer using the respective patterned light sensitive material and the removal of the light sensitive material.

FIG. 16 shows the structure of FIG. 15 following the removal of material from an area of spacer layer 290A (area 291A) and spacer layer 290B (area 291B) using the respective patterned DFR layer. In one embodiment, the removal may be done by an etch process. FIG. 16 also shows the structure after the removal of the DFR layer.

Figure 17:
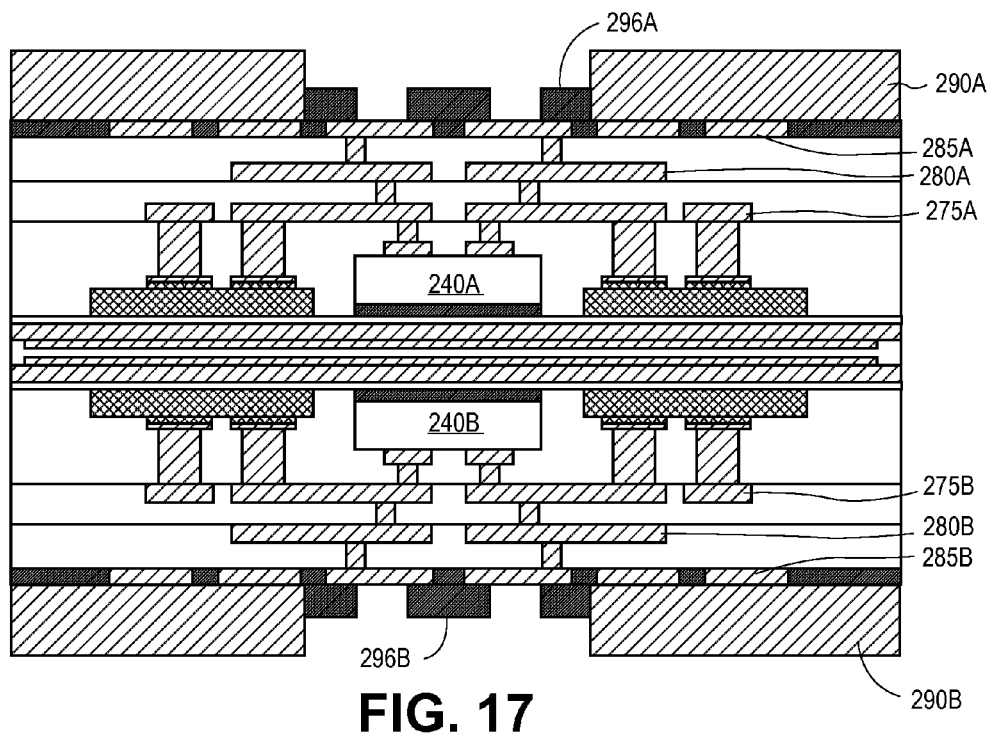
FIG. 17 shows the structure of FIG. 16 following the introduction and patterning of a fifth dielectric layer in area including the exposed third conductive layer.

FIG. 17 shows the structure of FIG. 16 following the introduction and patterning of a dielectric material in area 291A and area 291B, respectively. In one embodiment, the dielectric material is glass cloth introduced as a film. FIG. 17 shows dielectric layer 296A and dielectric layer 296B of, for example, glass cloth patterned with vias openings to patterned conductive layer or line 285A and conductive layer or line 285B using, for example, a laser process. In another embodiment, dielectric layer 296A/296B introduced, for example, by way of a lamination process, may overlay on spacer layer 290A and 290B.

Figure 18:
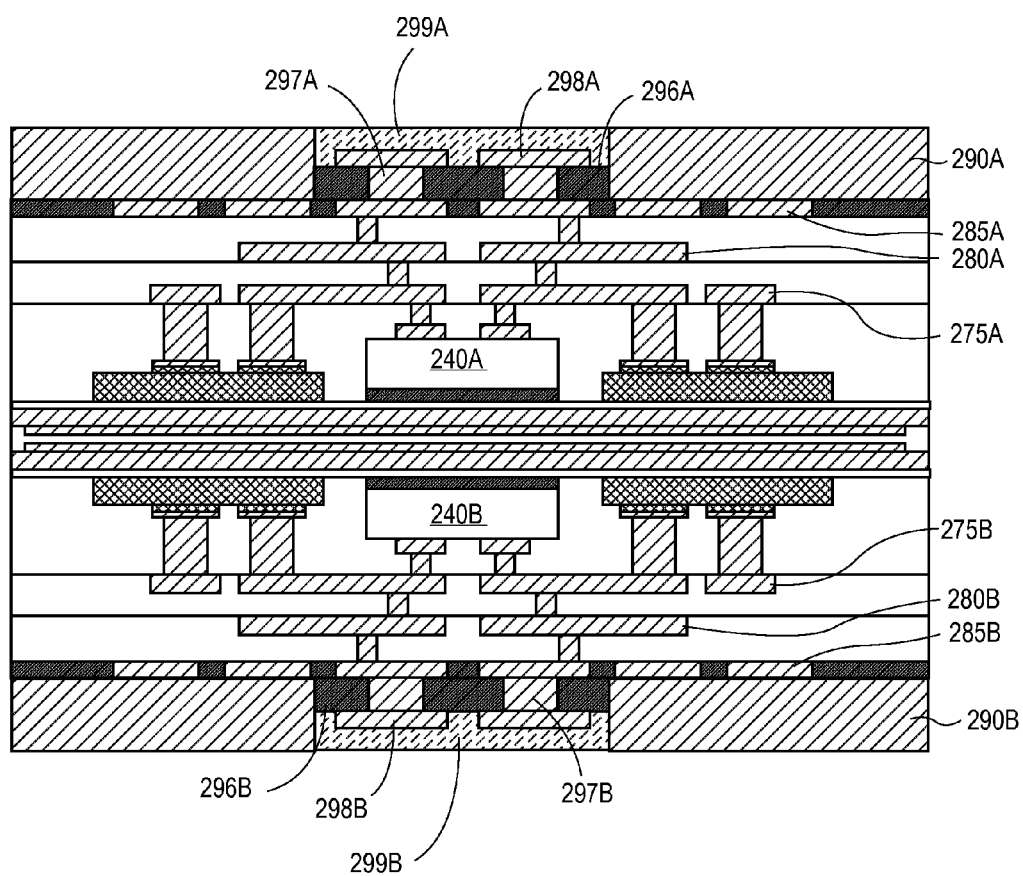
FIG. 18 shows the structure of FIG. 17 following the patterning of a fourth conductive layer on the fifth dielectric layer and conductive vias through the fifth dielectric layer to the third conductive layer.

FIG. 18 shows the structure of FIG. 17 following the patterning of an additional conductive layer or line (a fourth line) with conductive layer or line 298A and conductive layer or line 298B and conductive vias 297A and conductive vias 297B through the respective dielectric layers to patterned conductive layer or line 285A and 285B, respectively. A suitable material for patterned conductive layer or line 298A/298B and for conductive vias 297A/297B is copper deposited, for example, by an electroplating process. FIG. 18 also shows the introduction of a dielectric material over patterned conductive layer/line 298A/298B. FIG. 18 shows dielectric layer 299A and dielectric layer 299B on conductive layer 298A and conductive layer 298B, respectively. In one embodiment where dielectric layer 296A/296B overlays on spacer layer 290A/290B, dielectric layer 299A/299B may overlay on dielectric layer 296A/296B and spacer layer 290A/290B. In that situation, a planarization process is performed to polish the structure to expose spacer layer 290A/290B.

Figure 19:
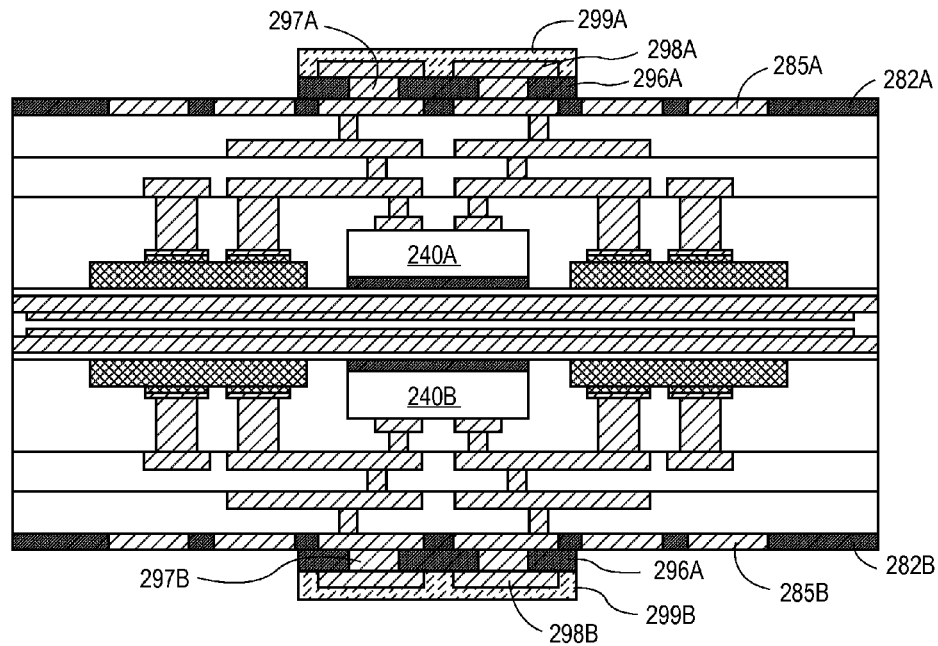
FIG. 19 shows the structure of FIG. 18 following the removal of the second spacer layer and underlying conductive layer.

FIG. 19 shows the structure of FIG. 18 following the removal of spacer layer 290A and spacer layer 290B. In one embodiment, the spacer layer and conductive layer may be removed by a wet blasting process. Removal of the spacer layer proceeds to expose a portion of patterned conductive layer or line 285A and patterned conductive layer or line 285B, respectively, that was previously covered by the spacer layer. The exposed portions of patterned conductive layer or line 285A/285B will be used to connect to a secondary device (e.g., a package or die). Thus, in one embodiment, a conductive material such as gold may be deposited on the exposed patterned conductive layer or line to improve an electrical connection with a secondary device.

Figure 20:
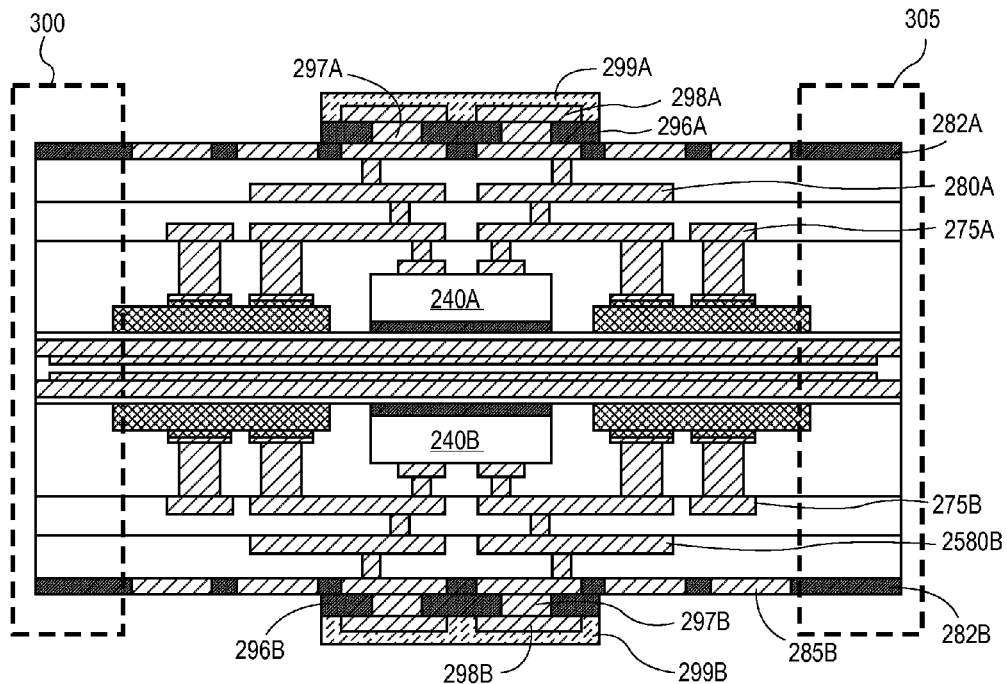
FIG. 20 shows the structure of FIG. 19 and indicates a singulation zone to separate the two packages that have been described from other packages or as well as to define the xy dimensions of the two packages.

In the description of the process to form a microelectronic package such as package 110 (FIG. 1), for convenience, the process has to this point been described with regard to the formation of two packages on a sacrificial substrate, one representatively above the other. It is appreciated that, in one embodiment, additional packages may be formed at the same time on the same sacrificial substrate, representatively, side by side one another. Accordingly, FIG. 20 shows the structure of FIG. 19 undergoing a singulation process to separate the two packages that have been described from other packages or as well as to define the xy dimensions of the two packages. One singulation process is by mechanical sawing. Another option is laser cutting. FIG. 20 shows area 300 and area 305 on the left and right side, respectively, designating the area for the singulation.

Figure 21:
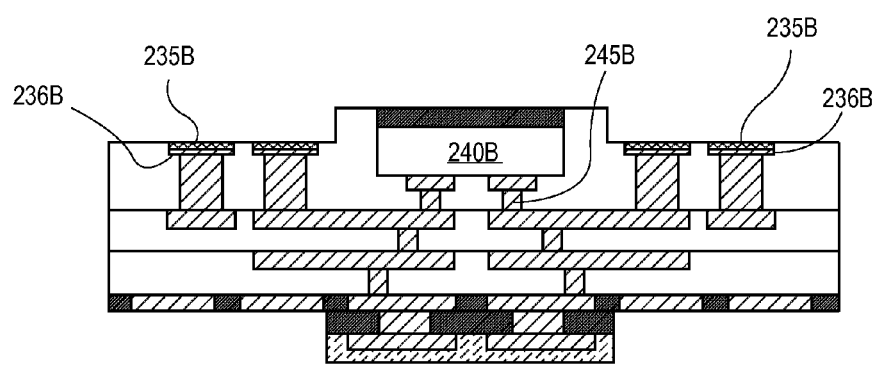
FIG. 21 shows a portion of the structure of FIG. 20 following the separation of the structure into two individual package portions by removal of sacrificial substrate, first spacer layer and copper foils.

FIG. 21 shows a portion of the structure of FIG. 20 following the separation of the structure into two individual package portions by removal of sacrificial substrate 210 and copper foils 215A and 215B. By removing the individual package portions from sacrificial substrate 210, FIG. 21 shows a portion of a free standing microelectronic package that has a die (die 240B) connected at a device side to a build-up carrier including a number of alternating layers of electrically conductive material (four levels of conductive traces) and dielectric or insulating material. FIG. 21 also shows the portion of the structure following the removal of spacer layer 230B and dielectric layer 225B (see, for example, FIG. 7 and the associated text). One way to remove spacer layer 230B of copper and dielectric layer 225B of ABF is by a wet blast process. The removal of the spacer layer and dielectric layer proceeds to expose contact pads 235B/236B. Contact pads 235B/236B will be used to connect the package to a substrate such as a printed circuit board.

Figure 22:
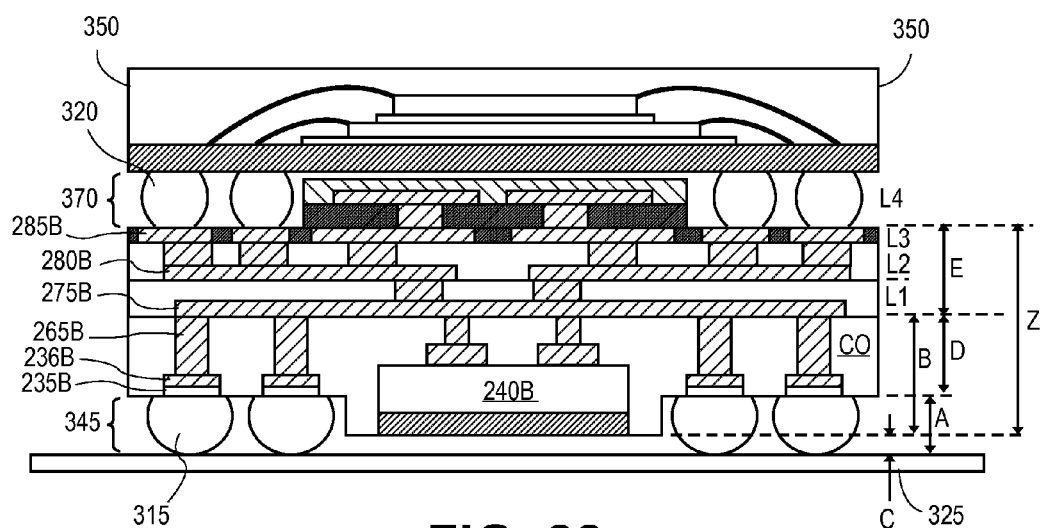
FIG. 22 shows the package of FIG. 21 connected to a substrate at contact points associated with the first conductive layer and a secondary package connected contact points associated with the third conductive layer.

FIG. 22 shows the package of FIG. 21 inverted. The package is connected to substrate 325 that is, for example, a printed circuit board. As illustrated, die 240B of the package is disposed at a base of the package. Cavity 345 is formed laterally from the die between the package and substrate 325 with contact pads 235B in the cavity. The package is connected to substrate 325, in this embodiment, through solder material connections (e.g., solder balls) disposed in cavity 345 at contact pads 235B.

At a top portion of the package (as viewed), the package includes a protruding portion including patterned conductive layer or line 298B and laterally adjacent to the protruding portion exposed contact pads of patterned conductive layer or line 285B. In this embodiment, the package is connected to a secondary device. Secondary device 350 is, for example, a package including a die or dice such as memory dice or other die (e.g., processor, system on a chip). With secondary device 350 disposed on the package, cavity 370 is created with contact pads of patterned conductive layer or line 285B in the cavity. The package is connected to secondary device 350 through solder material connections 320 (e.g., solder balls) disposed in cavity 370 at the contact pads of patterned conductive layer or line 285B.

FIG. 22 shows POP device integration assembly or apparatus where embedded die 240B (e.g., a microprocessor) is connected to the base package (a BBUL package) through bottom or first conductive layer or line 275B (L1). Embedded die 240B is electrically connected to package 350 (e.g., a package including one or more memory devices) through conductive layers of the base package (e.g., 275B (L1), 280B (L2)) and POP pads at conductive layer 285B (L3). Die 240B is also electrically connected to input/output (I/O) devices on substrate 325 through vias 265B. The described configuration provides reduced interconnect routing between die 240B and package 350 and I/O devices of substrate 325 than previous POP assembly configurations. Reduced communication latency between devices and lower power consumption can be realized with the described configuration. Still further, the configuration utilizes conductive layer 298B (L4) effectively by incorporating routing and contact points or pads in the level.

The dual-sided cavity design of the base package (cavity 345, cavity 370) reduces the overall POP assembly thickness (z-height) with a potential to achieve greater than 25 percent base package z-height reduction over, for example, a POP assembly that might include only a single cavity between the base package and a secondary package (e.g., a POP assembly that only includes cavity 370). Representatively, dimensions shown in FIG. 22 include:

A=bottom BGA height, 100 μm
B=BBUL die thickness+CO-L1 via depth, 159 μm
C=BGA standoff to die backside film, 30 μm
D=L1 to contact pad, 89 μm
E=substrate thickness from L1 to L3, 85 μm
Z=base package thickness, A+D+E, 100+89+85=274 μm.

Figure 23:
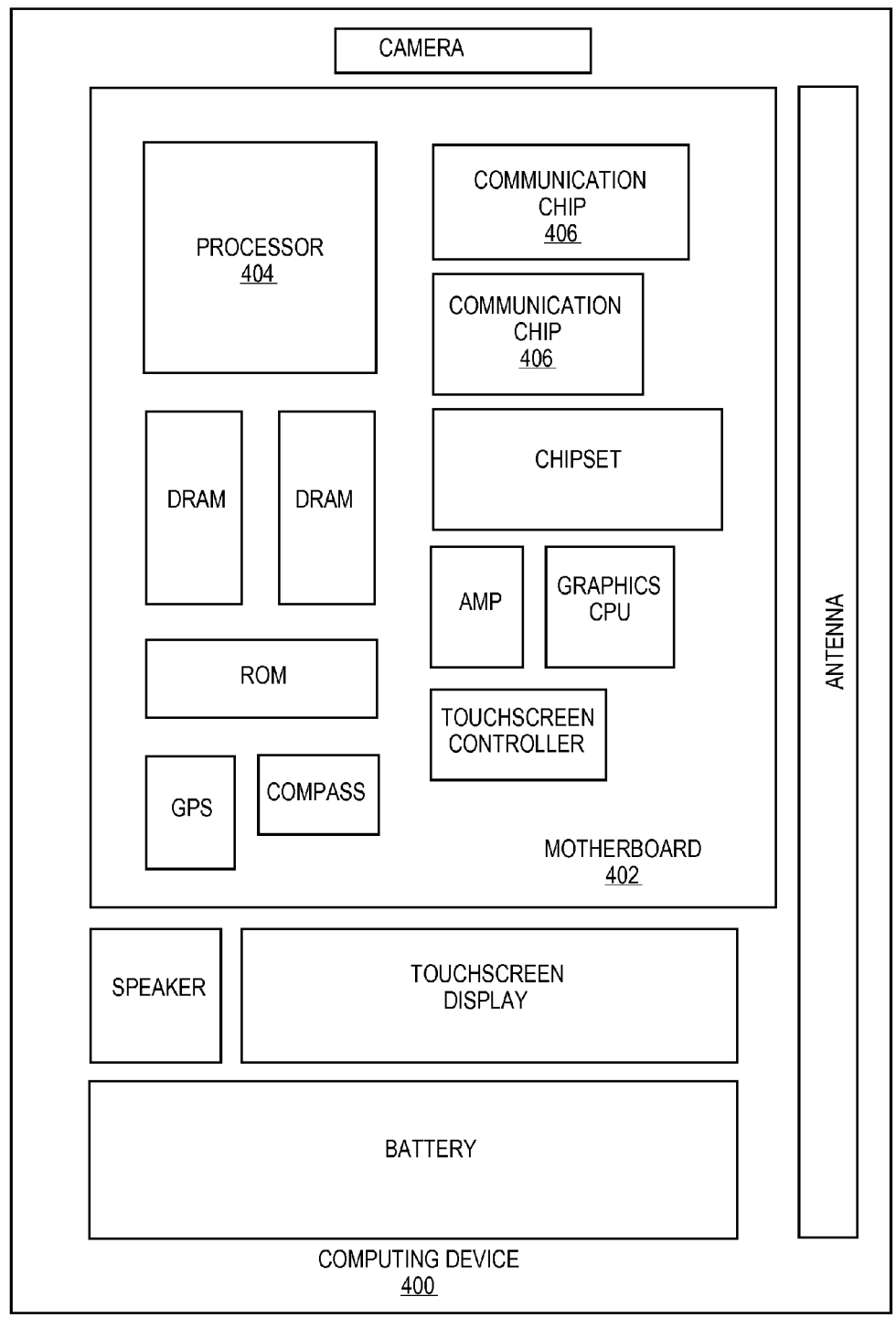
FIG. 23 illustrates a schematic illustration of a computing device.

FIG. 23 illustrates a computing device 400 in accordance with one implementation. Computing device 400 houses board 402. Board 402 may include a number of components, including but not limited to processor 404 and at least one communication chip 406. Processor 404 is physically and electrically connected to board 402. In some implementations the at least one communication chip 406 is also physically and electrically connected to board 402. In further implementations, communication chip 406 is part of processor 404.

Depending on its applications, computing device 400 may include other components that may or may not be physically and electrically connected to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations, the package formed in accordance with embodiment described above utilizes BBUL technology with a carrier as described including a die embedded therein in at a base of the carrier body and a cavity formed between the carrier and board 402 where electrical connections are made to the board (through, for example, solder material contacts). The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, package is based on BBUL technology such as described above that enables stacking at a reduced z-height of various devices, including but not limited to, a microprocessor chip (die) with a memory die with a graphics die with a chip set with GPS. Such package includes the dual-sided cavity confirmation described above.

In further implementations, another component housed within computing device 400 may contain a microelectronic package that incorporates a primary BBUL carrier implementation such as described above.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

The following examples pertain to embodiments.

Example 1 is an apparatus including a die having a thickness dimension and a die area defined by a length dimension and a width dimension; and a build-up carrier having a carrier area greater than the die area, the build-up carrier including a plurality of alternating layers of conductive material and dielectric material disposed on a device side of the die and dielectric material embedding a portion of the thickness dimension of the die; and a plurality of carrier contact points configured for mounting the build-up carrier to a substrate, the plurality of carrier contact points disposed at a gradation between the device side of the die and the embedded the thickness dimension of the die wherein at least one of the plurality of carrier contact points is coupled to at least one of the alternating layers of conductive materials.

In Example 2, the plurality of carrier contact points of the apparatus of Example 1 include a first plurality of carrier contact points and the gradation includes a first gradation and a plurality of the layers of conductive material include an ultimate layer disposed furthest from the die, the carrier further includes a plurality of second carrier contact points disposed at a second gradation between the ultimate layer of conductive material and the die.

In Example 3, the second gradation in the apparatus of Example 2 is in a plane defined by a penultimate layer of the plurality of layers of conductive material.

In Example 4, the die of the apparatus of Example 1 includes contact points on a device side and at least one of the plurality of layers of conductive material is coupled to at least one of the contact points of the die.

In Example 5, the carrier contact points of the apparatus of Example 1 are configured for mounting of the build-up carrier to a printed circuit board.

In Example 6, the second carrier contact points of the apparatus of Example 2 are configured for connection of the build-up carrier to a secondary device or package.

In Example 7, the die of the apparatus of Example 1 includes a dielectric layer on a side opposite the device side.

Example 8 is a method including disposing a die on a sacrificial substrate with a device side of the die opposite the sacrificial substrate; forming a build-up carrier adjacent a device side of a die, wherein the build-up carrier includes a plurality of alternating layers of conductive material and dielectric material, and dielectric material embedding a portion of a thickness dimension of the die and defining a gradation between the device side of the die and a backside of the die, the gradation including a plurality of carrier contact points configured for mounting the build-up carrier to the substrate; and separating the die and the build-up carrier from the sacrificial substrate.

In Example 9, prior to forming the build-up carrier in the method of Example 8, the method includes disposing a spacer layer on the sacrificial substrate, the spacer layer including an opening to accommodate the die on the sacrificial substrate and dielectric material to embed a portion of the thickness dimension of the die, the spacer layer having a thickness equivalent to a thickness of the first gradation, and after forming the build-up carrier, separating the die and the build-up carrier from the sacrificial substrate includes separating from the spacer layer.

In Example 10, forming the build-up carrier in the method of Example 9 includes forming the plurality of carrier contact points on the spacer layer.

In Example 11, the plurality of carrier contact points in the method of Example 10 are configured for connection of the build-up carrier to a printed circuit board.

In Example 12, the gradation in the method of Example 8 includes a first gradation and forming the build-up carrier includes patterning the penultimate layer of the plurality of conductive layers and forming a spacer layer on the patterned penultimate layer, the spacer layer including an opening to accommodate the ultimate layer of the plurality of conductive layers, the spacer layer having a thickness equivalent to a thickness of a second gradation; and patterning the ultimate layer of the plurality of conductive layers, and after forming the build-up carrier, removing the spacer layer.

In Example 13, forming the build-up carrier in the method of Example 11 includes disposing dielectric material on the patterned ultimate layer of the plurality of conductive layers.

In Example 14, patterning the penultimate layer of the plurality of conductive layers in the method of Example 12 includes patterning the penultimate layer into the second plurality of carrier contact points configured for connection of the build-up carrier to a secondary device or package.

In Example 15, any of the methods of Examples 8-14 are used in the formation of a package including at least one die (e.g., an integrated circuit substrate).

Example 16 includes a package including a microprocessor disposed in a carrier, the microprocessor including a first side and an opposite second side including a device side with contact points and a microprocessor area defined by a length dimension and a width dimension; the carrier including a carrier area greater than the microprocessor area; a plurality of alternating layers of conductive material and dielectric material disposed on the second side of the microprocessor with, of a plurality of the layers of conductive material, an ultimate layer of conductive material disposed furthest from the microprocessor and with dielectric material embedding a portion of a thickness dimension of the microprocessor; a plurality of first carrier contact points disposed at a first gradation between the second side of the microprocessor and the dielectric material embedding the thickness dimension of the microprocessor; and a plurality of second carrier contact points disposed at a second gradation between the ultimate layer of conductive material and the microprocessor; and a printed circuit board coupled to the first carrier contact points.

In Example 17, the apparatus of Example 16 further includes a secondary device or package coupled to the second carrier contact points.

In Example 18, the second gradation of the apparatus of Example 16 includes a thickness dimension equivalent to a separation between the ultimate layer of conductive material and a penultimate layer of the plurality of layers of conductive material.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the claims but to illustrate it. The scope of the claims is not to be determined by the specific examples provided above. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. An apparatus comprising:
a die having a thickness dimension and a die area defined by a length dimension and a width dimension; and
a build-up carrier having a carrier area greater than the die area, the build-up carrier comprising:
a plurality of alternating layers of conductive material and dielectric material disposed on a device side of the die and dielectric material embedding a portion of the thickness dimension of the die;
a first plurality of carrier contact points configured for mounting the build-up carrier to a substrate, the first plurality of carrier contact points disposed on a first side of the plurality of the layers of conductive material and disposed at a first gradation between the device side of the die and an embedded thickness dimension of the die wherein a difference between the first gradation and a backside of the die defines a cavity between the build-up carrier and a plane defined by the backside of the die wherein at least one of the first plurality of carrier contact points is coupled to at least one of the alternating layers of conductive materials; and
a second plurality of carrier contact points disposed on a second side of the plurality of the layers of conductive material opposite the first side and disposed at a second gradation between two of the plurality of layers of conductive material.

2. The apparatus of claim 1, wherein the second gradation is in a plane defined by a penultimate layer of the plurality of layers of conductive material.

3. The apparatus of claim 1, wherein the die comprises contact points on a device side and at least one of the plurality of layers of conductive material is coupled to at least one of the contact points of the die.

4. The apparatus of claim 1, wherein the carrier contact points are configured for mounting of the build-up carrier to a printed circuit board.

5. The apparatus of claim 1, wherein the second carrier contact points are configured for connection of the build-up carrier to a secondary device or package.

6. The apparatus of claim 1, wherein the die comprises a dielectric layer on a side opposite the device side.

7. An apparatus comprising:
a package comprising a microprocessor disposed in a carrier;
the microprocessor comprising a first side and an opposite second side comprising a device side with contact points and a microprocessor area defined by a length dimension and a width dimension; and
the carrier comprising:
a carrier area greater than the microprocessor area;
a plurality of alternating layers of conductive material and dielectric material disposed on the second side of the microprocessor with, of the plurality of the layers of conductive material, an ultimate layer of the plurality of the layers of conductive material is disposed furthest from the microprocessor and with dielectric material embedding a portion of a thickness dimension of the microprocessor;
a plurality of first carrier contact points disposed at a first gradation between the second side of the microprocessor and the dielectric material embedding the thickness dimension of the microprocessor;
a plurality of second carrier contact points disposed at a second gradation between the ultimate layer of conductive material and a penultimate layer of the plurality of the layers of conductive material; and
a printed circuit board coupled to the first carrier contact points,
wherein a difference between the gradation and the first side of the microprocessor defines a cavity between the carrier and the printed circuit board.

8. The apparatus of claim 7, further comprising a secondary device or package coupled to the second carrier contact points.

9. The apparatus of claim 7, wherein the second gradation disposed at a thickness dimension equivalent to a separation between the ultimate layer of conductive material and a penultimate layer of the plurality of layers of conductive material.

* * * * *